United States Patent [19]
Sung et al.

[11] Patent Number: 5,680,357
[45] Date of Patent: Oct. 21, 1997

[54] HIGH SPEED, LOW NOISE, LOW POWER, ELECTRONIC MEMORY SENSING SCHEME

[75] Inventors: Chih-Ta Star Sung, Princeton, N.J.; Lyle Albertson, Cupertino, Calif.

[73] Assignee: Hewlett Packard Company, Palo Alto, Calif.

[21] Appl. No.: 709,983

[22] Filed: Sep. 9, 1996

[51] Int. Cl.$^6$ ...................................................... G11C 7/00
[52] U.S. Cl. ...................... 365/210; 365/185.21; 365/205
[58] Field of Search ........................................... 365/205, 207, 365/208, 210, 203, 185.2, 185.21

[56] References Cited

U.S. PATENT DOCUMENTS

| | | | |
|---|---|---|---|
| 4,342,102 | 7/1982 | Puar | 365/207 |
| 4,884,241 | 11/1989 | Tanaka | 365/210 |
| 5,282,169 | 1/1994 | Paseucci | 365/210 |
| 5,327,379 | 7/1994 | Paseueci | 365/190 |

*Primary Examiner*—David C. Nelms
*Assistant Examiner*—Son Mai

[57] ABSTRACT

An electronic memory. The electronic memory includes memory cells and corresponding reference memory cells. Wordlines are connected to the memory cells and the corresponding reference memory cells. If an accessed memory cell has previously been programmed to a first state, an output from the memory cell is connected to a bitline. An output from a selected reference memory cell is connected to a reference bitline. The bitline and the reference bitline are connected to a differential input sense amplifier. The differential input sense amplifier detects the voltage differential between the bitline and the reference bitline. If the memory cell is accessed and the memory cell is in the first state, the memory cell drives the voltage potential on the bitline from a precharge voltage to a discharge voltage at a first rate. If the memory cell is selected and the memory cell is in a second state, the memory cell does not effect the voltage potential on the bitline and the voltage potential on the bitline remains at the precharge voltage. If the reference memory cell is selected, the reference memory cell drive the voltage potential on the reference bitline from the precharge voltage to the discharge voltage at a second rate. The first rate is faster than the second rate. Therefore, if the selected memory cell is in the first state, the differential sense amplifier will output a first voltage level. If the selected memory cell is in the second state, the differential amplifier will output a second voltage level.

9 Claims, 4 Drawing Sheets

HIGH SPEED, LOW NOISE, LOW POWER, ELECTRONIC MEMORY SENSING SCHEME

FIELD OF INVENTION

This invention relates generally to electronic memory. In particular, it relates to a differential input sensing scheme connected to a bitline of an electronic memory cell.

BACKGROUND

Read only memory (ROM) typically includes a number of memory locations arranged in a matrix of rows and columns. The contents of a memory location are read by applying an input voltage to a selected wordline, or row, and sensing whether the voltage of a corresponding bitline, or column, changes. The bitline is typically capacitively loaded, and is generally pre-charged to a predetermined voltage prior to reading the memory location.

ROM typically uses a sense amplifier to sense the state of the selected bitline. One type of sense amplifier is a single input sense amplifier that has the bitline as the single input to the sense amplifier. The sense amplifier senses whether the bitline is above or below a predetermined threshold voltage. The sense amplifier generates an output that is at one of two voltage potentials. The first voltage potential corresponds with the bitline being at a voltage level less than the threshold voltage and the second potential corresponds with the bitline being at a voltage level greater than the threshold voltage.

The design of the sense amplifier generally includes consideration of several performance characteristics. Typically, the most important performance characteristics are speed of operation and power dissipation. That is, it is desirable that the sense amplifier sense the bitline voltage as quickly as possible, and that the sense amplifier dissipate the least amount of power while sensing the bitline voltage. Additionally, the comparison between the bitline voltage and the threshold voltage should be precise. External disturbances and noise should not affect the sense amplifier output.

The act of charging and discharging the bitline results in power consumption. The greater the swing between pre-charged and discharged voltage levels, the greater the power consumption. Therefore, the differential between the pre-charge voltage level and the discharge voltage level is important in memory design.

External noise coupled into the sense amplifier can cause the sense amplifier to inadvertently switch from one output voltage potential to another output voltage potential. That is, the noise coupled into the sense amplifier can cause the sense amplifier to inadvertently mis-detect when the bitline is at a voltage potential less than or greater than the threshold voltage.

FIG. 1 shows a prior art ROM sense amplifier configuration. The configuration includes row (wordline) and column select lines. If the row and column select lines are active for a given ROM cell, the contents of the ROM cell are coupled to an input of a sense amplifier 2. The sense amplifier 2 compares a voltage representing the ROM cell contents with a threshold voltage and generates an output at one of two voltage potentials.

For this configuration, a memory cell is implemented with a FET 3. The FET 3 has a gate which is connected to a wordline 4. The wordline 4 is one of the previously mentioned row select lines. The source of the FET 3 is connected to a circuit ground. The memory cell can be programed to one of two states. For the first state the drain of the FET 3 is electrically connected to the bitline 5. For the second state the drain of the FET 3 is not electrically connected to anything. The first state can correspond to the memory cell being programmed with a logic one. The second state can correspond to the memory cell being with a logic zero. The bitline 5 is connected to a column FET 6. The column FET 6 has a gate which is connected to a column select line 7.

Before the memory cell is selected, the bitline 5 is at a precharge voltage. The memory cell is selected by driving the wordline 4 and the column select line 7 to a high potential. If the memory cell is in the first state when selected, the input to the sense amplifier 2 gradually ramps to a discharge voltage as capacitance on the bitline is discharged from the precharge voltage by current flowing through the FET 3. If the memory cell is in the second state when selected, the input to the sense amplifier gradually ramps to the precharge voltage.

The limitations of the configuration are primarily due to the large voltage swing on the bitline 5 that takes place every time the memory cell is selected. The bitline 5 has parasitic capacitance which greatly slows the speed that the voltage potential on the bitline 5 can change. The parasitic capacitance and the large voltage swing both slow the time required to determine the contents of the memory cell. Another limitation is that the single input sense amplifier 2 dissipates power even when the memory cell is not being accessed. The sense amplifier 2 continuously draws direct current (DC) even when the input of the sense amplifier 2 is not loaded.

FIG. 2 shows another prior art ROM sense amplifier configuration. This configuration is the same as the configuration shown in FIG. 1 except the sense amplifier is configured differently. Similar to the single input sense amplifier 1 of FIG. 1, this sense amplifier 9 dissipates DC power even when the memory cells connected to the sense amplifier 9 are not being accessed. Additionally, the sense amplifier requires a $V_{REF}$ voltage. The generation of the $V_{REF}$ voltage requires additional circuitry and power. It is desirable to have a sense amplifier configuration which operates quickly, is immune to noise and dissipates very little power.

SUMMARY OF THE INVENTION

The present invention includes an electronic memory sensing scheme. The sensing scheme of this invention operates quickly, is immune to noise and dissipates very little power. This invention includes memory cells which provide a first input to a differential sense amplifier and reference memory cells which provide a second input to the differential sense amplifier. A specific reference memory cell corresponds with each of the memory cells. The differential sense amplifier is configured to detect the difference between a voltage potential of a bitline associated with the memory cell and the voltage potential of a reference bitline associated with the corresponding reference memory cell.

An embodiment of this invention includes a memory device having a memory cell and a reference memory cell. The memory cell and the reference memory cell are both connected to a wordline. A bitline is connected to an output of the memory cell if the memory cell is programmed to a first state. A reference bitline is connected to an output of the reference memory cell. The bitline and the reference bitline are both inputs to a differential sense amplifier. The differential sense amplifier generates a sense output at a first voltage potential if a voltage potential on the bitline is greater than a voltage potential on the reference bitline and the differential sense amplifier generates a sense output at a second voltage potential if a voltage potential on the bitline is less than a voltage potential on the reference bitline. If the wordline is driven to an active state, the memory cell drives the bitline from a precharge voltage level to a discharge voltage level at a first rate if the memory cell is programmed to the first state. The bitline remains at the precharge voltage level if the memory cell is programmed to a second state. If the wordline is driven to an active state, the reference memory cell drives the reference bitline from the precharge voltage level to the discharge voltage level at a second rate. For this embodiment, the second rate is slower than the first rate.

Other aspects and advantages of the present invention will become apparent from the following detailed description, taken in conjunction with the accompanying drawings, illustrating by way of example the principles of the invention.

DETAILED DESCRIPTION

Figure 1:
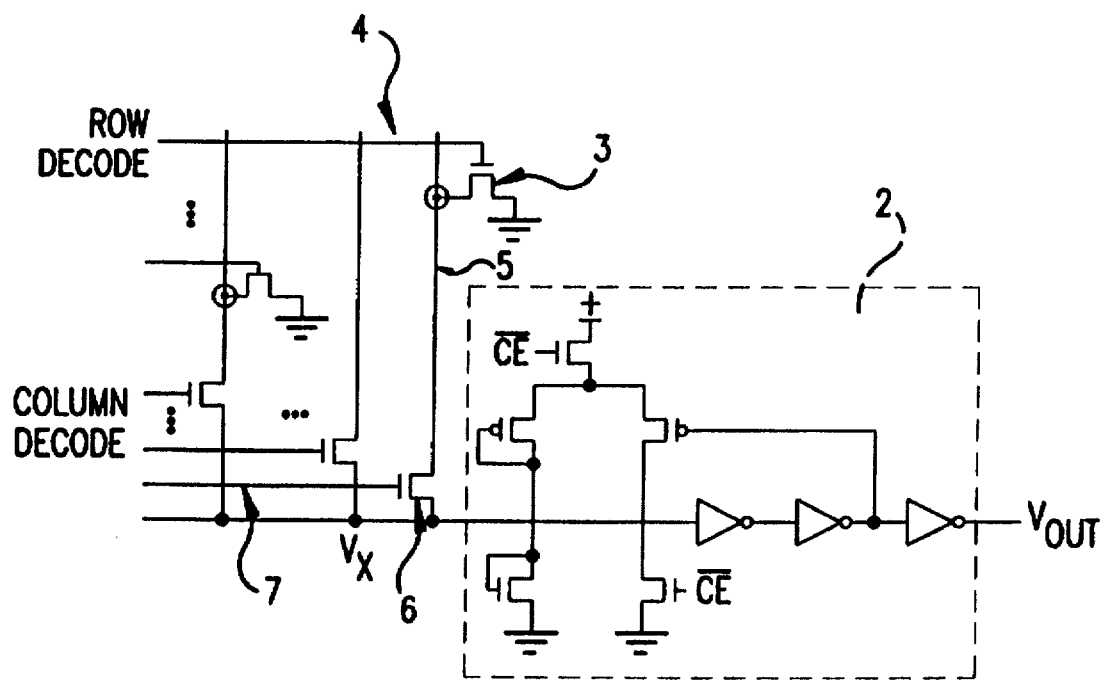
FIG. 1 shows a prior art ROM sense amplifier structure.
Figure 2:
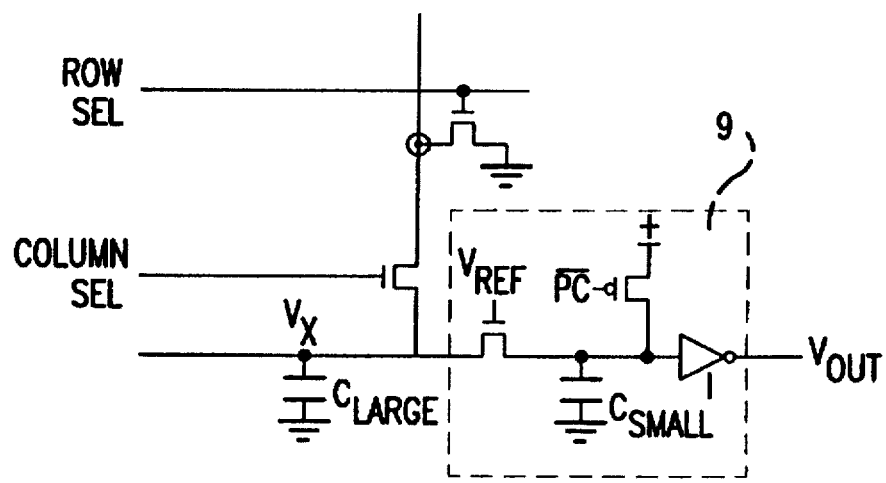
FIG. 2 shows another prior art ROM sense amplifier structure.

As shown in the drawings for purposes of illustration, the invention is embodied in an electronic memory sensing scheme. The invention includes memory cells and reference memory cells. Each memory cell is connected to a bitline if the memory cell is programmed to a first state. Each reference memory cell is connected to a reference bitline. The bitline and reference bitline are inputs to an associated differential input sense amplifier. The memory cell is selected by applying an input voltage to a wordline which is connected to the memory cell and the corresponding reference memory cell. Each differential input sense amplifier detects whether the bitline connected to the differential sense amplifier is at a voltage potential greater or less than the voltage potential of the reference bitline. The detection is determined by the programmed state of the associated memory cell.

Each memory cell is configured so that if the memory cell is selected and the memory cell has been programmed to a first state, the memory cell will drive the bitline connected to the memory cell to a discharge voltage potential at a first rate. Each reference memory cell is configured so that if the reference memory cell is selected, the reference memory cell will drive the reference bitline connected to the reference memory cell to the discharge voltage potential at a second rate. The first rate is faster than the second rate, and the bitline and the reference bitline are precharge to the same voltage before the memory cell and the reference memory cell are selected. Therefore, the differential sense amplifier will detect that the bitline is at a lower voltage potential than the reference bitline if the memory cell is selected and is programmed to the first state. If the memory cell is programmed to a second state, the bitline associated with the memory cell will not deviate from the precharge voltage. Therefore, the differential sense amplifier will detect that the bitline is at a greater voltage potential than the reference bitline when the selected memory cell is programmed to the second state.

This architecture for electronic memory sensing offers advantages over prior architectures because the differential sense amplifier of this invention can detect whether a selected memory cell is programmed to the first state more quickly than prior art sense amplifiers. The voltage potential on a bitline associated with a selected memory cell is not required to deviate as greatly as the bitline of the prior architectures in order for the sense amplifier to detect whether the selected memory cell is programmed to the first state. Therefore, the time required to determine the state of a selected memory cell is substantially less.

The reference memory cells are fabricated physically close to the memory cells and on the same integrated circuit chip. Therefore, both the reference memory cells and the memory cells experience the same integrated circuit chip fabrication variations, temperature variations and voltage supply imperfections. These similarities improve the accuracy of the voltage comparison between the output of the reference memory cell and the memory cell. Furthermore, the extra circuitry and extra integrated circuit chip surface area required to implement the reference memory cells is generally less than one percent more than is required for the prior art implementation of the memory cells.

This invention also includes a differential sense amplifier configuration that dissipates minimal DC power. Therefore, the electronic memory sensing scheme of this invention dissipates less power than prior schemes.

Figure 3:
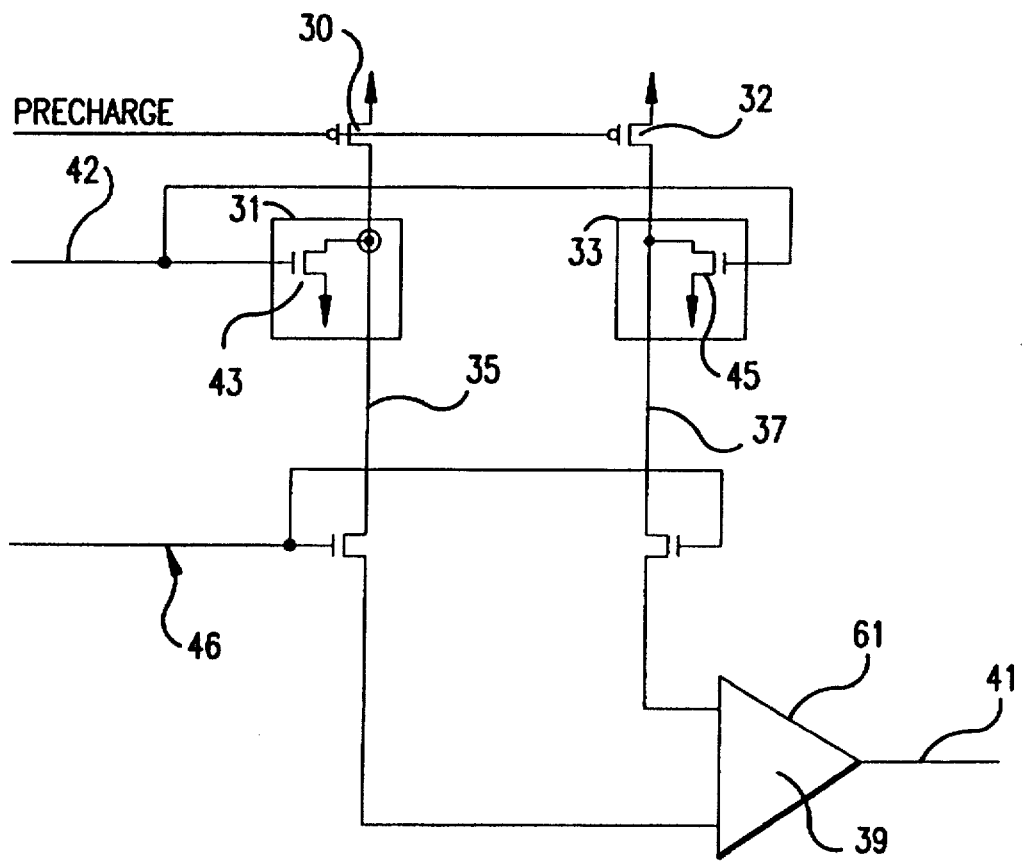
FIG. 3 shows an embodiment of the ROM sensing scheme of this invention.

FIG. 3 shows an embodiment according to this invention. The embodiment includes a memory cell 31 and a reference memory cell 33. The memory cell 31 is connected to a bitline 35 if the memory cell 31 is programmed to the first state. The reference memory cell 33 is connected to a reference bitline 37. The bitline 35 and the reference bitline 37 are inputs to a differential input sense amplifier 39 when a column select line 46 is active. The differential input sense amplifier 39 has an output 41 which is driven to one of two voltage potentials. The output 41 is driven to a first voltage potential if the bitline 35 is at a lower voltage than the reference bitline 37, and to a second voltage potential if the bitline 35 is at a higher voltage than the reference bitline 37.

The memory cell 31 and the reference memory cell 33 are both connected to a wordline 42. The wordline 42 and the column select 46 are active if the contents of the memory 31 are being selected. That is, the wordline 42 and the column select line 46 are in an active state if a user is attempting to determine the state of the memory cell 31. The memory cell 31 is always in either a first state or a second state. The memory cell 31 being programmed to the first state can correspond to the memory cell 31 storing an active bit or a logic one bit. The memory cell 31 being programmed to the second state can correspond to the memory cell 31 storing a non-active or logic zero bit.

In one embodiment of this invention, the memory cell 31 includes a memory FET 43 and the reference memory cell 33 includes a reference FET 45. A gate of the memory FET 43 is connected to the wordline 42. A source of the memory FET 43 is generally connected to a low impedance or ground. A drain of the memory FET 43 is electrically connected to the bitline 35 if the memory cell 31 is programmed to the first state. If the memory cell 31 is programmed to the second state, then the drain of the memory FET 43 is not connected to the bitline 35.

A gate of the reference FET 45 is connected to the wordline 42. A source of the reference FET 45 is generally connected to a low impedance or ground. A drain of the reference FET 45 is electrically connected to the reference bitline 37.

When the wordline is in an inactive state, the memory FET 43 and the reference FET 45 are turned off and not conducting current. When the memory FET 43 and the reference FET 45 are off, the bitline and the reference bitline are at a precharge voltage. The precharge voltage can be predetermined by connecting a precharge circuit to the bitline and the reference bitline. When the wordline transitions to an active state, the memory FET 43 will turn on if the memory cell 31 is programmed to the first state. If the memory cell 31 is programmed to the second state, the drain of the memory FET 43 is not electrically connected to anything. Therefore, the memory FET 43 does not mm on and the bitline remains at the precharge voltage. When the wordline transitions to an active state, the reference FET 45 will always turn on.

For the embodiment shown in FIG. 3, if the memory cell 31 is programmed to the first state and the wordline is active, the memory FET 43 will conduct current from the bitline 35. The physical characteristics of the memory FET 43 determine how much current the memory FET 43 conducts from the bitline 35.

If the wordline is active, the reference FET 45 will conduct current from the reference bitline 37. The physical characteristics of the reference FET 45 determine how much current the reference FET 45 conducts from the reference bitline 37.

In another embodiment of this invention, the width of a channel forming the memory FET 43 is greater than the width of a channel forming the reference FET 45 although the lengths of the two channels are about the same. When the two FETs are turned on, this geometry results in a greater current flow through the wider-channel memory FET 43 than through the narrower-channel reference FET 45.

In this embodiment, the bitline 35 and the reference bitline 37 are precharged to substantially the same voltage through the precharge FETs 30, 32. Furthermore, the bitline 35 and the reference bitline 37 have substantially the same amount of parasitic capacitance associated With them. As a result, when the wordline 42 goes active (high) and the memory cell 31 has been programmed to the first state, the bitline 35 will ramp down from the precharge voltage at a faster rate than the reference bitline 37. The differential sense amplifier 39 will detect the difference in voltages and will drive the output 41 to the first voltage potential.

If the wordline 42 goes active and the memory cell 31 is programmed to the second state, the voltage on the bitline 35 will remain at the precharge voltage. However, the voltage on reference bitline 37 will ramp down from the precharge voltage. The differential sense amplifier 39 will detect the difference in voltages and will drive the output 41 to the second voltage potential.

Figure 4:
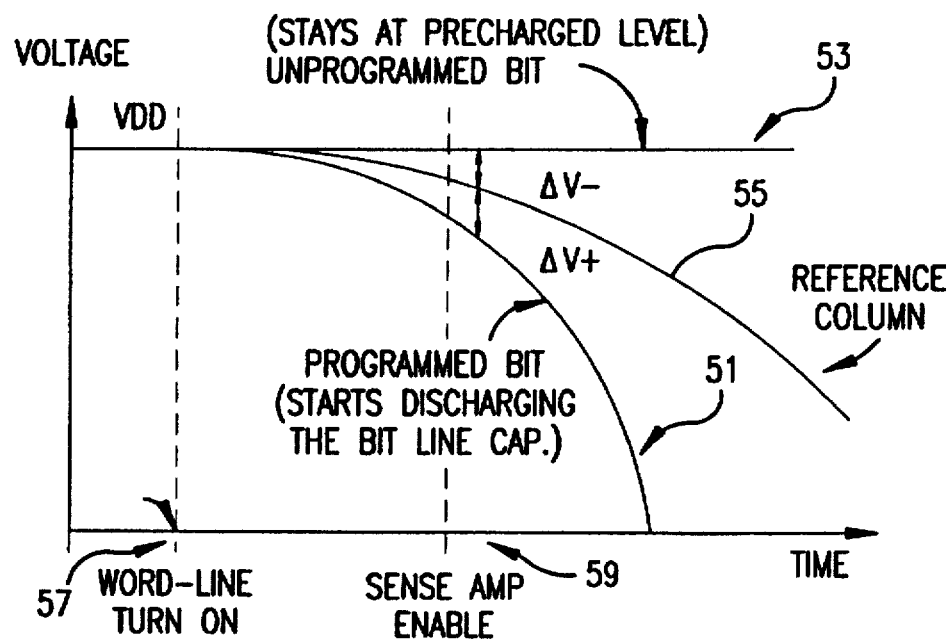
FIG. 4 shows a time line of the voltage potential on the bitline and the reference bitline of this invention when a memory cell is selected.

FIG. 4 shows a time line of the voltage potentials on the bitline 35 and the reference bitline 37 when wordline 42 is active. The precharge voltage is VDD. The curve 51 shows the voltage on the bitline 35 when the wordline 42 is active and the memory cell 31 is programmed to the first state. The voltage on the bitline 35 is VDD when the wordline just turns active (indicated by 57 on the figure). The memory FET 43 conducts current from the bitline 35 which causes the voltage on the bitline 35 to ramp down as depicted by the curve 51. If the memory cell 31 is programmed to the second state, the drain of the memory FET 43 is not connected to the bitline 35 and the voltage on the bitline 35 remains at the precharge voltage level VDD. Curve 53 depicts the voltage on the bitline 35 when the memory cell 31 is programmed to the second state. Curve 55 shows the voltage on the reference bitline 37 when the wordline 42 is active. The reference FET 45 does not conduct as much current as the memory FET 43. Therefore, the voltage on the reference bitline 37 can never ramp down as quickly as the voltage on the bitline 35.

The differential sense amplifier 39 is enabled a specified point in time (indicated by 59 on FIG. 4) after the memory cell is selected. That is, the output of the differential sense amplifier is sampled after enough time has passed to ensure a detectable deviation exists between the voltage on the bitline 35 and the voltage on the reference bitline 37. A sense amplifier chip enable 61 is indicated on FIG. 3.

Figure 5:
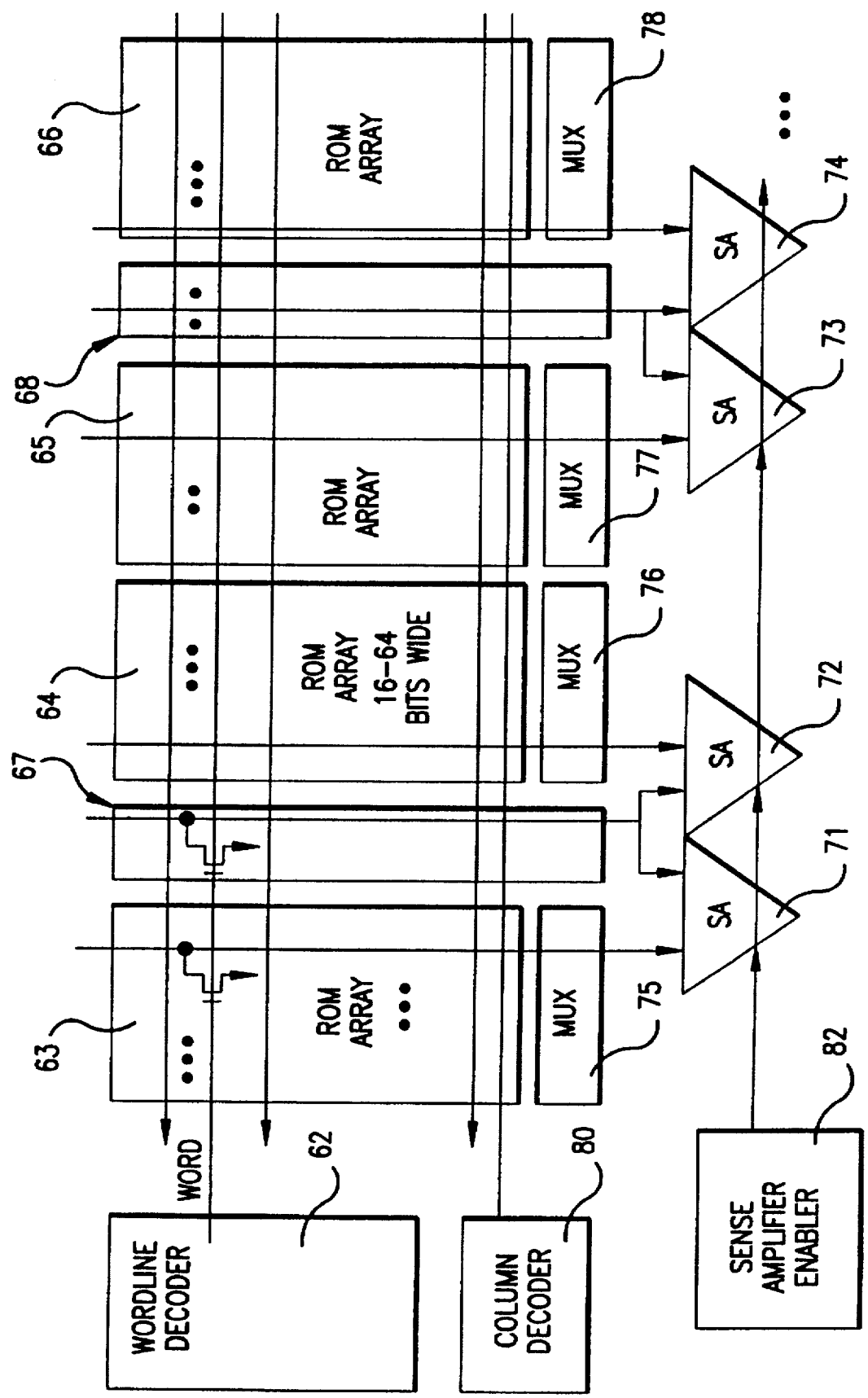
FIG. 5 shows another embodiment of the ROM sensing scheme of this invention.

FIG. 5 shows another embodiment of this invention. This embodiment includes memory cells that are arranged in rows and columns within arrays 63, 64, 65, 66. Arrays 63, 64 are adjacent a reference column 67. Arrays 65, 66 are adjacent a reference column 68. The reference columns 67, 68 include a column of reference memory cells. A wordline decoder 62 controls wordlines which are connected to each row of the arrays 63, 64, 65, 66 and to each reference memory cell of the reference columns 67, 68. Each row within the arrays 63, 64, 65, 66 corresponds with a reference memory cell within an adjacent reference column 67, 68. Corresponding rows and reference memory cells are connected to a common wordline. Therefore, a row and the corresponding reference memory cell are both selected at the same time.

Each array 63, 64, 65, 66 is connected to one of a plurality of multiplexers 75, 76, 77, 78. Each of the multiplexers 75, 76, 77, 78 has a single output which is connected to one of a plurality of differential sense amplifier 71, 72, 73, 74. For the embodiment shown in FIG. 5, the array 63 is connected to the multiplexer 75 and the multiplexer 75 has a single output connected to the differential sense amplifier 71. The array 64 is connected to the multiplexer 76 and the multiplexer 76 has a single output connected to the differential sense amplifier 72. The array 65 is connected to the multiplexer 77 and the multiplexer 77 has a single output connected to the differential sense amplifier 73. The array 66 is connected to the multiplexer 78 and the multiplexer 78 has a single output connected to the differential sense amplifier 74. An output of the reference column 67 is connected to the differential sense amplifier 71 and the differential sense amplifier 72. An output of the reference column 68 is connected to the differential sense amplifier 73 and the differential sense amplifier 74.

A column decoder 80 drives the multiplexers. The multiplexers determines which memory cell of a selected row within an array is electrically connected to the differential sense amplifier associated with the memory cell. The output of the selected memory cell is compared with the output of the corresponding reference memory cell for determination of the state of the selected memory cell.

In another embodiment of this invention, each of the memory cells include a memory FET and each of the reference memory cells include a reference FET. The width of a channel forming the memory FET is greater than the width of a channel forming the reference FET although the lengths of the two channels are about the same. When the two FETs are turned on, this geometry results in a greater current flow through the wider-channel memory FET than through the narrower-channel reference FET.

A sense amplifier enabler 82 enables the differential sense amplifiers a predetermined amount of time after the selection of a memory cell to ensure a voltage difference between the output of the selected memory cell and the corresponding selected reference memory cell.

Figure 6:
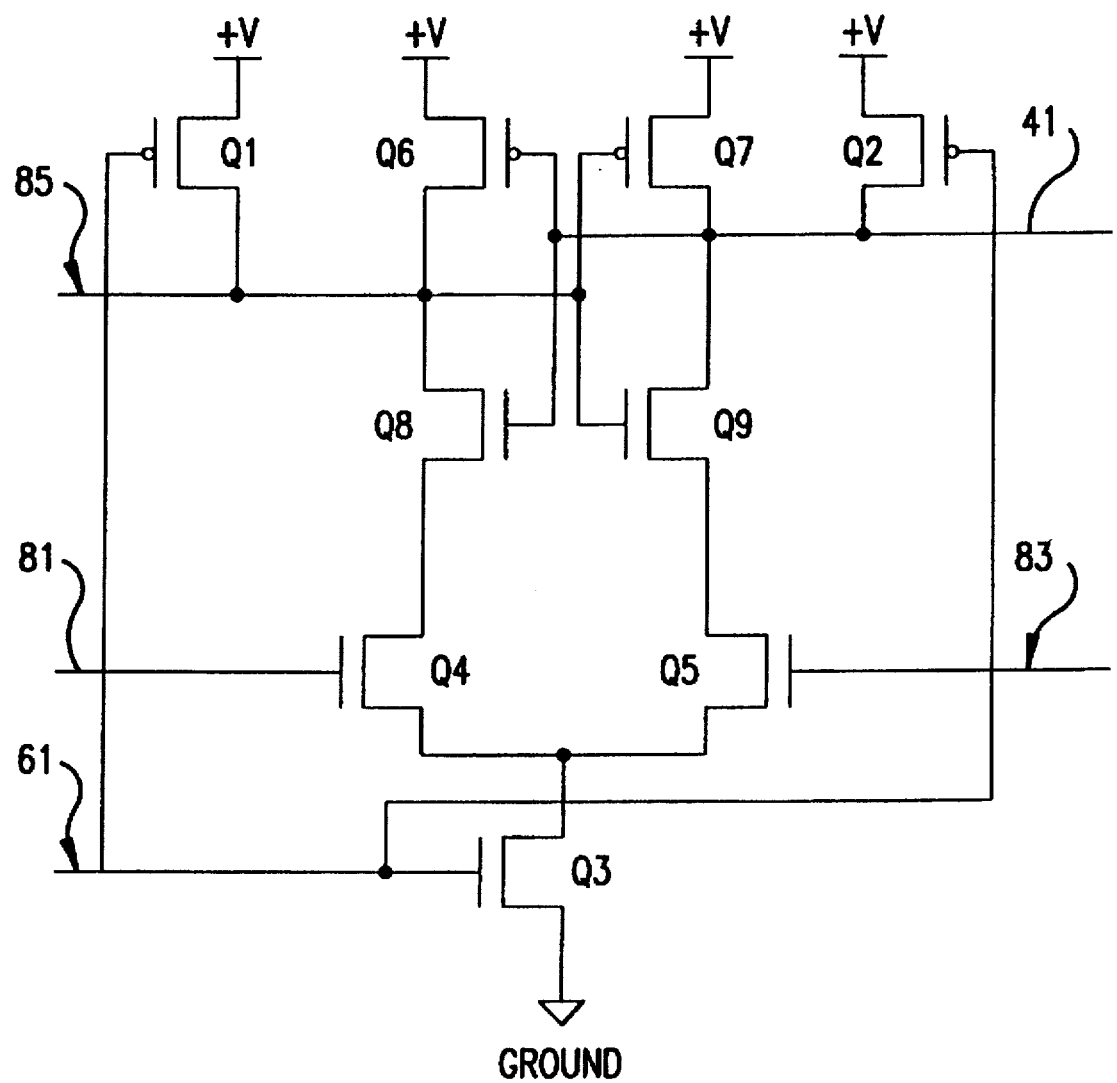
FIG. 6 shows a circuit which has the required functionality of the differential sense amplifier of this invention.

FIG. 6 depicts the circuitry that is included within the differential sense amplifier of an embodiment of this invention. The output 41 and the sense amplifier chip enable 61 are shown. A first differential input 81 is connected to a memory cell. A second differential input 83 is connected to a reference memory cell. A first signal representing the state of a selected memory cell is coupled to the output 41. The differential sense amplifier couples a second signal that is an inverted representation of the first signal to a second output 85. The differential sense amplifier dissipates minimal DC power.

The circuitry of FIG. 6 includes transistors Q1, Q2 and Q3 which are controlled by the sense amplifier chip enable 61. The first differential input 81 is connected to the gate of Q4 and the second differential input 83 is connected to the gate of Q5. A connection between transistors Q7 and Q9 drives the output 41. A connection between the transistors Q6 and Q8 drives the second output 85.

Although specific embodiments of the invention have been described and illustrated, the invention is not to be limited to the specific forms or arrangements of parts so described and illustrated. The invention is limited only by the claims.

What is claimed is:

1. A memory device comprising:

a memory cell that generates a memory voltage when the memory cell is accessed, the memory voltage ramping at a first rate from a precharge voltage to a discharge voltage if the memory cell has previously been programmed to a first state and the memory voltage remaining at the precharge voltage if the memory cell has previously been programmed to a second state;

a reference memory cell generating a reference voltage, the reference voltage ramping at a second rate from the precharge voltage to the discharge voltage when the memory cell is selected, the second rate being slower than the first rate; and a differential sense amplifier responsive to the reference voltage and the memory voltage to generate a first sense output voltage if the memory voltage exceeds the reference voltage and a second sense output voltage if the reference voltage exceeds the memory voltage.

2. The memory device as recited in claim 1, wherein the memory cell comprises a memory field effect transistor.

3. The memory device as recited in claim 2, wherein the reference memory cell comprises a reference field effect transistor.

4. The memory device as recited in claim 3, wherein the memory field effect transistor has a memory transistor width and a memory transistor length, the memory transistor width and memory transistor length selected to set the first rate.

5. The memory device as recited in claim 4, wherein the reference field effect transistor has a reference transistor width and a reference transistor length, the reference transistor width and the reference transistor length being selected to set the second rate.

6. The memory device as recited in claim 2, wherein a drain of the field effect transistor is connected to a bitline when the memory cell has previously been programmed to the first state.

7. The memory device as recited in claim 1, further comprising a plurality of memory cells and a plurality of reference memory cells, the memory cells being organized into memory columns and each memory column being associated with one of a plurality of bitlines, the reference memory cells being organized into reference columns, each reference column being associated with one of a plurality of reference bitlines.

8. The memory device as recited in claim 7, further comprising a plurality of differential sense amplifiers wherein each bitline is electrically connected to a single differential sense amplifier, and each reference bitline is electrically connected to more than one differential sense amplifier.

9. The memory device as recited in claim 8, wherein a multiplexer provides the connection of a bitline to a differential sense amplifier.

* * * * *